(12) United States Patent
Tatsuoka et al.

(10) Patent No.: US 10,307,830 B2
(45) Date of Patent: Jun. 4, 2019

(54) SURFACE-COATED CUTTING TOOL HAVING HARD COATING LAYER THAT EXHIBITS EXCELLENT CHIPPING RESISTANCE

(71) Applicant: MITSUBISHI MATERIALS CORPORATION, Tokyo (JP)

(72) Inventors: Sho Tatsuoka, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 180 days.

(21) Appl. No.: 15/306,018

(22) PCT Filed: Apr. 23, 2015

(86) PCT No.: PCT/JP2015/062333
§ 371 (c)(1),
(2) Date: Dec. 19, 2016

(87) PCT Pub. No.: WO2015/163391
PCT Pub. Date: Oct. 29, 2015

(65) Prior Publication Data
US 2017/0165758 A1 Jun. 15, 2017

(30) Foreign Application Priority Data

Apr. 23, 2014 (JP) .................................. 2014-089047
Apr. 20, 2015 (JP) .................................. 2015-085625

(51) Int. Cl.
*B23B 27/14* (2006.01)
*B23C 5/16* (2006.01)
(Continued)

(52) U.S. Cl.
CPC ............ *B23B 27/148* (2013.01); *B23B 27/14* (2013.01); *B23C 5/16* (2013.01); *C23C 16/34* (2013.01);
(Continued)

(58) Field of Classification Search
USPC ........... 407/119; 51/307, 309; 428/216, 336, 428/697, 698, 699, 701, 702
See application file for complete search history.

(56) References Cited

U.S. PATENT DOCUMENTS

| 2010/0323176 A1 | 12/2010 | Van Den Berg et al. |
| 2011/0003126 A1 | 1/2011 | Van Den Berg et al. |
| 2016/0040285 A1* | 2/2016 | Tatsuoka ................. C23C 16/36 407/119 |

FOREIGN PATENT DOCUMENTS

| CN | 1042500 A | 5/1990 |
| CN | 1138881 A | 12/1996 |

(Continued)

OTHER PUBLICATIONS

Extended European Search Report dated Nov. 7, 2017 for the corresponding European Patent Application No. 15783674.3.

(Continued)

*Primary Examiner* — Archene A Turner
(74) *Attorney, Agent, or Firm* — Leason Ellis LLP

(57) ABSTRACT

The hard coating layer includes at least a complex nitride or complex carbonitride layer expressed by the composition formula $(Ti_{1-x}Al_x)(C_yN_{1-y})$. The average Al content ratio $x_{avg}$ the average C content ratio $y_{avg}$ satisfy $0.60 \leq x_{avg} \leq 0.95$ and $0 \leq y_{avg} \leq 0.005$, respectively, each of the $x_{avg}$ and $y_{avg}$ is in atomic ratio. The crystal grains constituting the complex nitride or complex carbonitride layer include a crystal grain having the NaCl face-centered cubic structure. A predeter- (Continued)

mined average crystal grain misorientation exists in the crystal grains having the NaCl face-centered cubic structure.

9 Claims, 2 Drawing Sheets

(51) Int. Cl.
    *C23C 16/34*     (2006.01)
    *C23C 16/36*     (2006.01)
    *C23C 16/40*     (2006.01)
    *C23C 16/455*     (2006.01)
    *C23C 28/04*     (2006.01)
    *C23C 30/00*     (2006.01)
    *C22C 29/04*     (2006.01)
    *C22C 29/08*     (2006.01)
    *B22F 5/00*     (2006.01)
    *C22C 26/00*     (2006.01)

(52) U.S. Cl.
    CPC ............ *C23C 16/36* (2013.01); *C23C 16/403* (2013.01); *C23C 16/45523* (2013.01); *C23C 16/45589* (2013.01); *C23C 28/048* (2013.01); *C23C 30/00* (2013.01); *C23C 30/005* (2013.01); *B22F 2005/001* (2013.01); *B23C 2224/22* (2013.01); *B23C 2228/10* (2013.01); *C22C 29/04* (2013.01); *C22C 29/08* (2013.01); *C22C 2026/003* (2013.01)

(56) References Cited

FOREIGN PATENT DOCUMENTS

| | | | |
|---|---|---|---|
| CN | 1616712 | A | 5/2005 |
| EP | 0687744 | A | 12/1995 |
| JP | 2002-205207 | A | 7/2002 |
| JP | 2009-220260 | A | 10/2009 |
| JP | 2011-513594 | A | 4/2011 |
| JP | 2011-516722 | A | 5/2011 |
| JP | 2012-020391 | A | 2/2012 |
| JP | 2013-139065 | A | 7/2013 |
| JP | 2013-248675 | A | 12/2013 |
| JP | 2014-024130 | A | 2/2014 |
| WO | WO-2014/163081 | A | 10/2014 |

OTHER PUBLICATIONS

Office Action dated Nov. 27, 2017 for the corresponding Chinese Patent Application No. 201580026780.X.

Hidehiko Kimura, Yun Wang, Yoshiaki Akiniwa, Keisuke Tanaka, "Misorientation Analysis of Plastic Deformation of Austenitic Stainless Steel by EBSD and X-Ray Diffraction Methods", Transactions of the Japan Society of Mechanical Engineers (Series A), Dec. 2005, pp. 1722 to 1728, vol. 71, No. 712.

International Search Report dated Jun. 23, 2015 for the corresponding PCT Application No. PCT/JP2015/062333.

* cited by examiner

GRAIN ORIENTATION SPREAD (GOS VALUE)

GRAIN ORIENTATION SPREAD (GOS VALUE)

SURFACE-COATED CUTTING TOOL HAVING HARD COATING LAYER THAT EXHIBITS EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2015/062333, filed Apr. 23, 2015, and claims the benefit of Japanese Patent Applications No. 2014-089047, filed Apr. 23, 2014 and No. 2015-085625, filed Apr. 20, 2015, all of which are incorporated by reference herein in their entireties. The International Application was published in Japanese on Oct. 29, 2015 as International Publication No. WO/2015/163391 under PCT Article 21(2).

FIELD OF THE INVENTION

The present invention relates to a surface-coated cutting tool (hereinafter, referred as coated tool) that exhibits excellent cutting performance for a long-term usage in a high-speed intermittent cutting work, in which high heat is generated on alloy steel or the like and impacting load is exerted on the cutting edge, by having a hard coating layer with excellent chipping resistance.

BACKGROUND OF THE INVENTION

Conventionally, a coated tool, in which a surface of the tool body (hereinafter, collectively referred as the tool body) constituted from; tungsten carbide (hereinafter, referred as WC) based cemented carbide; titanium carbonitride (hereinafter, referred as TiCN) based cermet; or cubic boron nitride (hereinafter, referred as cBN) based ultra-high-pressure sintered material, is coated by a Ti—Al based complex nitride layer as a hard coating layer by the physical vapor deposition method, is known. In addition, it is known that such a hard coating layer exhibits excellent wear resistance. However, several proposals for improving the hard coating layer are made since: the coated tool that the above-mentioned Ti—Al based complex nitride layer coated on has relatively excellent wear resistance; but abnormal abrasion such as chipping and the like is likely to be occurred in usage in the high-speed intermittent cutting condition.

For example, a surface-coated cutting tool, in which a hard coating layer is formed on the surface of the tool body, is disclosed in Patent Literature 1 (Japanese Unexamined Patent Application, First Publication No. 2012-20391 (A)). In the surface-coated cutting tool disclosed in Japanese Unexamined Patent Application, First Publication No. 2012-20391 (A), the hard coating layer is constituted from one or more layers. Then, in the case where T1 and T2 are defined as the thickness of the thinnest part of the hard coating layer in the ridgeline part of the cutting edge and the thickness of the hard coating layer in the location 1 mm apart from the ridgeline of the cutting edge toward the rake face side, respectively, in the cross section dissecting the cutting tool in a specific plane, the relationship of T1<T2 is satisfied. In addition, Da and Db are set in specific parameter ranges, in the case where Da and Db are defined as the distance from the ridgeline of the cutting edge to the point a in the rake face direction and the distance from the ridgeline of the cutting edge to the point b in the flank face direction, respectively, on the surface of the hard coating layer. In addition, the misalignment of the crystal orientations of the crystal grains constituting the hard coating layer is set to 5° or more and less than 10° in the region corresponding to 10% or more of the region E occupying the thick part of 0.1T1 to 0.9T1 from the surface in the hard coating layer from the point a to the point b. By having the configurations explained above, a surface-coated cutting tool having excellent wear resistance and defect resistance is obtained in Japanese Unexamined Patent Application, First Publication No. 2012-20391 (A).

In the coated tool of Japanese Unexamined Patent Application, First Publication No. 2012-20391 (A), depositing TiAlN as the hard coating layer is disclosed. However, setting the Al content ratio x to 0.65 or more is not disclosed or suggested.

From this point of view, a method to increase the Al content ratio x to about 0.9 by forming the hard coating layer by the chemical vapor deposition method is proposed.

For example, Patent Literature 2 (Japanese Unexamined Patent Application, First Publication No. 2011-516722 (A)) discloses that a $(Ti_{1-x}Al_x)N$ layer having the Al content ratio value x of 0.65 to 0.95 is vapor deposited by performing chemical vapor deposition in the mixed reaction gas of $TiCl_4$; $AlCl_3$; and $NH_3$, in the temperature range of 650° C. to 900° C. The purpose of Japanese Unexamined Patent Application, First Publication No. 2011-516722 (A) is improving the heat insulating effect by placing an extra coating of $Al_2O_3$ layer on the above-mentioned $(Ti_{1-x}Al_x)N$ layer. Therefore, it is not clear what kind of influence on the cutting performance of the cutting tool can be obtained by forming the $(Ti_{1-x}Al_x)N$ layer having the Al content ratio value x increased to the level of 0.65 to 0.95.

In addition, for example, improving the heat resistance and fatigue strength of the coated tool by: coating the inner layer of a TiCN layer or a $Al_2O_3$ layer with an outer layer of a $(Ti_{1-x}Al_x)N$ layer (x is 0.65 to 0.90 in the atomic ratio), which is in a cubic crystal structure or cubic structure including a hexagonal structure, by the chemical vapor deposition method; and having the outer layer with compressive stress of 100 to 1100 MPa, is proposed in Patent Literature 3 (Japanese Unexamined Patent Application, First Publication No. 2011-513594 (A)).

Problems to be Solved by the Present Invention

Recently, there is strong demand for power-saving and energy-saving in cutting work. Accordingly, the trend of cutting work is shifted toward even faster and highly efficient cutting. Thus, coated tools with even more excellent abnormal damage resistance such as chipping resistance; defect resistance; peeling resistance; and the like, is demanded. At the same time, coated tools with excellent wear resistance for a long-term usage is demanded.

However, the coated tool described in Japanese Unexamined Patent Application, First Publication No. 2012-20391 (A) has the problem that wear resistance and chipping resistance are not necessarily sufficient when it is applied to high-speed intermittent cutting of alloy steel, since Japanese Unexamined Patent Application, First Publication No. 2012-20391 (A) has no thought on increasing the Al content ratio in the hard coating layer made of the $(Ti_{1-x}Al_x)N$ layer.

On the other hand, the $(Ti_{1-x}Al_x)N$ layer vapor deposited by the chemical vapor deposition method described in Japanese Unexamined Patent Application, First Publication No. 2011-516722 (A) has the problem that its toughness is inferior, even though a hard coating layer having a predetermined hardness and excellent wear resistance is obtained because: the Al content ratio x can be increased; and the structure can be formed.

In addition, the coated tool described in Japanese Unexamined Patent Application, First Publication No. 2011-513594 (A) has the problem that abnormal damage resistance such as chipping, defect, peeling, and the like is likely to occur and the coated tool does not exhibit satisfactory cutting performance necessarily when it is applied to high-speed intermittent cutting of alloy steel or the like, since toughness of the coated tool in Japanese Unexamined Patent Application, First Publication No. 2011-513594 (A) is inferior, even though it has a predetermined hardness and excellent wear resistance.

Thus, the technical problem to be solved in the present invention, which is the purpose of the present invention, is to provide a coated tool that: has excellent toughness; and exhibits excellent chipping resistance and wear resistance for a long-term usage, even in the case where the coated tool is applied to high-speed intermittent cutting work or the like of alloy steel or the like.

SUMMARY OF THE INVENTION

Means to Solving the Problems

The inventors of the present invention conducted intensive studies in order to improve chipping resistance and wear resistance of the coated tool, on which a hard coating layer including at least a Ti and Al complex nitride or complex carbonitride (hereinafter, referred as "(Ti, Al)(C, N)" or "$(Ti_{1-x}Al_x)(C_yN_{1-y})$") is vapor deposited by the chemical vapor deposition method, and obtained the following findings.

The conventional hard coating layer, which includes at least one layer of $(Ti_{1-x}Al_x)(C_yN_{1-y})$ layer and has a predetermined average layer thickness, has high wear resistance, in the case where the $(Ti_{1-x}Al_x)(C_yN_{1-y})$ layer is formed in a columnar form perpendicular to the tool body. On the other hand, the higher the anisotropy of the $(Ti_{1-x}Al_x)(C_yN_{1-y})$ layer, the lower the toughness of the $(Ti_{1-x}Al_x)(C_yN_{1-y})$ layer. As a result, chipping resistance and defect resistance are lowered; and the coated tool cannot exhibit a sufficient wear resistance for a long-term usage. In addition, the service life of the tool is not satisfactory.

Under the circumstances described above, the inventors of the present invention further conducted intensive studies on the $(Ti_{1-x}Al_x)(C_yN_{1-y})$ layer constituting the hard coating layer, and succeeded to improve both hardness and toughness by introducing strain in crystal grains having the cubic crystal structure based on a completely novel idea, in which the $(Ti_{1-x}Al_x)(C_yN_{1-y})$ layer contains crystal grains having the NaCl face-centered cubic crystal structure (hereinafter, referred as "the cubic crystal structure" or "cubic structure", occasionally) and the average crystal grain misorientation of the crystal grains having is set to 2° or more. As a result, a novel finding, which allows chipping resistance and defect resistance to be improved, is obtained.

Specifically, the inventors of the present invention found that: hardness and toughness of the $(Ti_{1-x}Al_x)(C_yN_{1-y})$ layer are improved compared to the conventional hard coating layer by introducing strain in crystal grains having the cubic crystal structure; and, as a result, chipping resistance and defect resistance are improved and the hard coating layer exhibits excellent wear resistance for a long-term usage, by satisfying the condition that the hard coating layer includes at least a Ti and Al complex nitride or complex carbonitride layer, which is deposited by a chemical vapor deposition method and an average content ratio $x_{avg}$, which is an average content ratio of Al with respect to a total amount of Ti and Al, and an average content ratio $y_{avg}$, which is an average content ratio of C with respect to a total amount of C and N, satisfy $0.60 \leq x_{avg} \leq 0.95$; and $0 \leq y_{avg} \leq 0.005$, respectively, in a case where a composition formula of the Ti and Al complex nitride or complex carbonitride layer is expressed by $(Ti_{1-x}Al_x)(C_yN_{1-y})$, each of the $x_{avg}$ and $y_{avg}$ is in atomic ratio; having a crystal grain with the cubic structure in the crystal grains constituting the complex nitride or complex carbonitride layer; and satisfying the condition that an area ratio of crystal grains having an average crystal grain misorientation of 2° or more relative to the Ti and Al complex nitride or complex carbonitride layer is 40% or more, when crystal orientations of the crystal grains are analyzed along a vertical cross-sectional direction with an electron beam backscattering analyzer and the average crystal grain misorientation of the crystal grains is obtained.

The $(Ti_{1-x}Al_x)(C_yN_{1-y})$ layer configured as described above can be deposited by the chemical vapor deposition method explained below, in which the composition of the reaction gas is changed periodically on the surface of the tool body, for example.

To the chemical vapor deposition reaction apparatus used, each of the gas group A, which is made of $NH_3$ and $H_2$, and the gas group B, which is made of $TiCl_4$, $Al(CH_3)_3$, $AlCl_3$, $NH_3$, $N_2$, and $H_2$, is supplied through independent gas supplying pipes leading in the reaction apparatus. The gas groups A and B are supplied in the reaction apparatus in such a way that the gas flows only in a shorter time than a specific period in a constant time interval in a constant period, for example. In this way, phase difference with the shorter time than the gas supplying time is formed in the gas supply of the gas groups A and B. Accordingly, the composition of the reaction gas on the surface of the tool body can be changed temporally, such as the gas group A (the first reaction gas), the mixed gas of the gas groups A and B (the second reaction gas), and the gas group B (the third reaction gas). In the present invention, there is no need to provide a long term exhausting process intending strict gas substitution. Thus, the temporal change of the composition of the reaction gas on the surface of the tool body can be changed among: a mixed gas, the major component of which is the gas group A (the first reaction gas); a mixed gas of the gas groups A and B (the second reaction gas); and a mixed, the major component of which is the gas group B (the third reaction gas) by: rotating the gas supply ports; rotating the tool bodies; or moving the tool body reciprocally as the gas supplying method, for example.

The $(Ti_{1-x}Al_x)(C_yN_{1-y})$ layer having a predetermined intended layer thickness is deposited, for example, by performing the thermal CVD method for a predetermined time on the surface of the tool body in the condition of: the gas group A including 2.0%-3.0% of $NH_3$ and 65%-75% of $H_2$; the gas group B including 0.6%-0.9% of $AlCl_3$, 0.2%-0.3% of $TiCl_4$, 0%-0.5% of $Al(CH_3)_3$, 12.5%-15.0% of $N_2$, and balance $H_2$; the pressure of the reaction atmosphere being 4.5 kPa-5.0 kPa; the temperature of the reaction atmosphere being 700° C.-900° C.; the supply period being 1 second to 5 seconds; the gas supply time per one period being 0.15 second to 0.25 second; and the phase difference of the gas supply of the gas groups A and B being 0.10 second to 0.20 second.

By supplying the gas groups A and B in such a way that each of the gas groups A and B reach to the surface of the tool body in different timings with time difference as explained above, local strains are formed in the crystal lattice by formation of local unevenness of the composition and by introduction of dislocation or point defect in the crystal grains. The inventors of the present invention found that such formation of strains improves toughness of the $(Ti_{1-x}Al_x)(C_yN_{1-y})$ layer significantly. Particularly, they found that defect resistance and chipping resistance are improved; and the hard coating layer exhibits excellent cutting performance for a long-term used even in high-speed intermittent cutting work of alloy steel or the like, in which intermittent and impact load is exerted on the cutting edge.

The present invention is made based on the above-described findings, and has aspects indicated below.

(1) A surface-coated cutting tool including: a tool body made of tungsten carbide-based cemented carbide, titanium carbonitride-based cermet, or cubic boron nitride-based ultra-high pressure sintered material; and a hard coating layer provided on a surface of the tool body, wherein (a) the hard coating layer includes at least a Ti and Al complex nitride or complex carbonitride layer, which is deposited by a chemical vapor deposition method and has an average layer thickness of 1 μm to 20 μm; and an average content ratio $x_{avg}$, which is an average content ratio of Al with respect to a total amount of Ti and Al in the Ti and Al complex nitride or complex carbonitride layer, and an average content ratio $y_{avg}$, which is an average content ratio of C with respect to a total amount of C and N in the Ti and Al complex nitride or complex carbonitride layer, satisfy $0.60 \leq x_{avg} \leq 0.95$; and $0 \leq y_{avg} \leq 0.005$, respectively, in a case where a composition formula of the Ti and Al complex nitride or complex carbonitride layer is expressed by $(Ti_{1-x}Al_x)(C_yN_{1-y})$, each of the $x_{avg}$ and $y_{avg}$ is in atomic ratio, (b) the complex nitride or complex carbonitride layer includes at least a phase of Ti and Al complex nitride or complex carbonitride having a NaCl face-centered cubic structure, and (c) an area ratio of crystal grains having an average crystal grain misorientation of 2° or more relative to the Ti and Al complex nitride or complex carbonitride layer is 40% or more, when crystal orientations of crystal grains of Ti and Al complex nitride or complex carbonitride having the NaCl face-centered cubic structure are analyzed along a vertical cross-sectional direction with an electron beam backscattering analyzer and the average crystal grain misorientation of the crystal grains is obtained.

(2) The surface-coated cutting tool according to the above-described (1), wherein the complex nitride or complex carbonitride layer is made of a single phase of Ti and Al complex nitride or complex carbonitride having the NaCl face-centered cubic structure.

(3) The surface-coated cutting tool according to the above-described (1), wherein the hard coating layer includes at least 70 area % or more of a phase of Ti and Al complex nitride or complex carbonitride having the NaCl face-centered cubic structure.

(4) The surface-coated cutting tool according to any one of the above-described (1) to (3), wherein a lower layer of a Ti compound layer, which is made of one or more layers of: a Ti carbide layer; a Ti nitride layer; a Ti carbonitride layer; a Ti oxycarbide layer; and a Ti oxycarbonitride layer, is provided between the tool body and the Ti and Al complex nitride or complex carbonitride layer, an average total layer thickness of the lower layer being 0.1 μm to 20 μm.

(5) The surface-coated cutting tool according to any one of the above-described (1) to (4), wherein an upper layer including at least an aluminum oxide layer is formed on the complex nitride or complex carbonitride layer, an average total layer thickness of the upper layer being 1 μm to 25 μm.

(6) The surface-coated cutting tool according to any one of the above-described (1) to (5), wherein the complex nitride or complex carbonitride layer is deposited by a chemical vapor deposition method using at least trimethyl aluminum as a reaction gas component.

In the present application, "average crystal grain misorientation" means the GOS (Grain Orientation Spread) value, which is explained later.

Effects of the Invention

In the surface-coated cutting tool, which is an aspect of the present invention, (hereinafter, referred as "the surface-coated cutting tool of the present invention" or "the cutting tool of the present invention"), a surface-coated cutting tool includes: a tool body; and a hard coating layer provided on a surface of the tool body. In addition, the hard coating layer includes at least a Ti and Al complex nitride or complex carbonitride layer, which is deposited by a chemical vapor deposition method and has an average layer thickness of 1 μm to 20 μm; and an average content ratio $x_{avg}$, which is an average content ratio of Al with respect to a total amount of Ti and Al, and an average content ratio $y_{avg}$, which is an average content ratio of C with respect to a total amount of C and N, satisfy $0.60 \leq x_{avg} \leq 0.95$; and $0 \leq y_{avg} \leq 0.005$, respectively, in a case where a composition formula of the Ti and Al complex nitride or complex carbonitride layer is expressed by $(Ti_{1-x}Al_x)(C_yN_{1-y})$, each of the $x_{avg}$ and $y_{avg}$ is in atomic ratio. In addition, there is a crystal grain with the cubic structure in the crystal grains constituting the complex nitride or complex carbonitride layer. In addition, an area ratio of crystal grains having an average crystal grain misorientation of 2° or more relative to the entire Ti and Al complex nitride or complex carbonitride layer is 40% or more, when crystal orientations of crystal grains are analyzed along a vertical cross-sectional direction with an electron beam backscattering analyzer and the average crystal grain misorientation of the crystal grains is obtained. By having the configurations described above, strains are formed in the crystal grains having the cubic structure; and hardness and toughness of the crystal grains are improved. As a result, the technical effect improving wear resistance without deteriorating wear resistance, is obtained; the hard coating layer exhibits excellent cutting performance for a long-term usage compared to the conventional hard coating layer; and lengthening the service life of the coated tool is achieved.

DETAILED DESCRIPTION OF THE INVENTION

Figure 1:
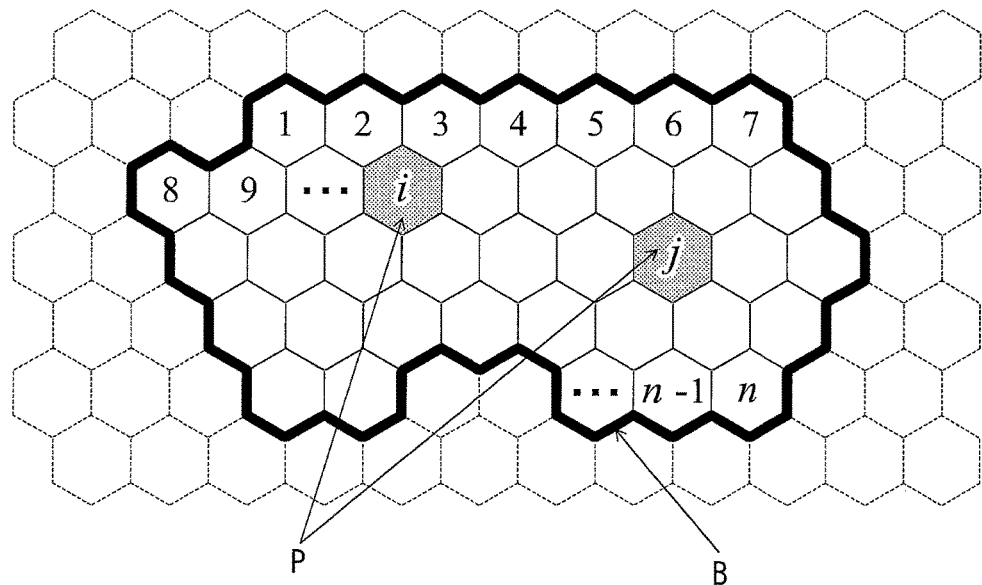
FIG. 1 is a schematic illustration of the measurement method of the average crystal grain misorientation of crystal grains having the NaCl face-centered cubic structure (cubic) in the Ti and Al complex nitride or complex carbonitride layer of the coated tool of the present invention.

Embodiments of the present invention are explained below.

Average layer thickness of the complex nitride or complex carbonitride layer constituting the hard coating layer:

The hard coating layer of the surface-coated cutting tool of the present invention includes at least a Ti and Al complex nitride or complex carbonitride layer represented by the composition formula, $(Ti_{1-x}Al_x)(C_yN_{1-y})$ deposited by chemical vapor deposition. Although, this complex nitride or complex carbonitride layer has high hardness and excellent wear resistance, the complex nitride or complex carbonitride layer exhibits the traits particularly well when the average layer thickness of the complex nitride or complex carbonitride layer is 1 µm to 20 µm. The reason for that is: if the average layer thickness were less than 1 µm, sufficient wear resistance would not be obtained for a long-term usage due to the layer thickness being too thin; and if it exceeded 20 µm, chipping would likely occur because crystal grains of the Ti and Al complex nitride or complex carbonitride layer become easy to coarsen. Thus, the average layer thickness is set to 1 µm to 20 µm.

Composition of the complex nitride or complex carbonitride layer constituting the hard coating layer:

In the complex nitride or complex carbonitride layer constituting the hard coating layer of the surface-coated cutting tool of the present invention, $x_{avg}$, which is the average content ratio of Al with respect to a total amount of Ti and Al, and $y_{avg}$, which is an average content ratio of C with respect to a total amount of C and N, are adjusted to satisfy $0.60 \leq x_{avg} \leq 0.95$; and $0 \leq y_{avg} \leq 0.005$, respectively (each of the $x_{avg}$ and $y_{avg}$ is in atomic ratio).

The reason for these is that if the average Al content ratio $x_{avg}$ were less than 0.60, hardness of the Ti and Al complex nitride or complex carbonitride layer would be deteriorated; and in the case where it is subjected to high-speed intermittent cutting of alloy steel or the like, its wear resistance would not be sufficient. On the other hand, if the average Al content ratio $x_{avg}$ exceeded 0.95, the average Ti content ratio would be decreased relatively. The reduction of the average Ti content ratio causes embrittlement to deteriorate chipping resistance. Thus, the average Al content ratio $x_{avg}$ is set to $0.60 \leq x_{avg} \leq 0.95$.

In addition, when the average content ratio $y_{avg}$ (in the atomic ratio) of the C component included in the complex nitride or complex carbonitride layer is in the trace amount in the range of $0 \leq y_{avg} \leq 0.005$, adhesion of the complex nitride or complex carbonitride layer to the tool body or the lower layer is improved; and impact during cutting is absorbed by improvement of lubricity. As a result, defect resistance and chipping resistance of the complex nitride or complex carbonitride layer are improved. On the other hand, if the average content ratio of the C component y were deviated from the range of $0 \leq y_{avg} \leq 0.005$, defect resistance and chipping resistance would be deteriorated reversely due to reduction of toughness of the complex nitride or complex carbonitride layer, and the deviation is not desirable. Thus, the average content ratio of the C component $y_{avg}$ is set to $\leq y_{avg} \leq 0.005$.

Average crystal grain misorientation of each of cubic crystal grains constituting the complex nitride or complex carbonitride layer (GOS value):

First, the complex nitride or complex carbonitride layer is analyzed along the vertical cross-sectional direction at the interval of 0.1 µm with an electron beam backscattering analyzer in the present invention. When there is crystal misorientation of 5° or more between adjacent measurement points P (hereinafter, refereed as pixels), the mid-parting line is defined as the grain boundary B as shown in FIG. 1. Then, the region surrounded by a single crystal boundary B is defined by one crystal grain. As an exemption, an independently-existing single pixel that has crystal misorientation of 5° or more to all of adjacent pixels is not regarded as a crystal grain. Only ones with connected pixels of 2 or more are regarded as a crystal grains.

Then, crystal misorientation is calculated in each of pixels in the crystal grain against to all of other pixels in the same crystal grain; and the averaged value of the calculated crystal misorientation is defined as the GOS value (Grain Orientation Spread). A schematic illustration is shown in FIG. 1. The GOS value is explained in detail in the document "Transactions of the Japan Society of Mechanical Engineers, Series A, Vol. 71, No. 712 (2005 December), Article No. 05-0367, p 1722-1728", for example. The "average crystal grain misorientation" means this GOS value in the present specification. The mathematical formula expressing the GOS value is shown below. In the mathematical formula: n is the total number of pixels in the same crystal grain; i and j are unique numbers designated to each of different pixels in the crystal grains ($1 \leq i$, and $j \leq n$, in the example shown in FIG. 1); $\alpha_{ij(i \neq j)}$ is the crystal misorientation obtained from the crystal orientation in the pixel i and the crystal orientation in the pixel j.

$$GOS = \frac{\sum_{i,j=1}^{n} \alpha_{ij(i \neq j)}}{n(n-1)} \quad \text{[Mathematical formula 1]}$$

The histogram showing the area ratio of the average crystal grain misorientation can be made by: performing the measurement in the measurement range of 10 µm of the width and the layer thickness of the length, along the vertical cross-sectional direction in five different view fields; obtaining the total number of pixels belonging to the cubic crystal grain constituting the complex nitride or complex carbonitride layer; classing the average crystal grain misorientation with 1° incremental; tallying the number of pixels of crystal grains of each class of the average crystal grain misorientation; and dividing the each of tallied numbers by the above-mentioned total number of pixels. As a result, it is found that: crystal orientation in the crystal grain is not perfectly constant but varies somewhat; and based on the obtained histogram, the area ratio of crystal grains having the average crystal grain misorientation of 2° or more relative to the entire Ti and Al complex nitride or complex carbonitride layer is 40% or more as in the area ratio in the coated tool of the present invention (see FIGS. 3 and 4.)

As explained above, in the crystal grains constituting the Al and Ti complex nitride or complex carbonitride layer of the surface-coated cutting tool of the present invention, there is a larger extent of variation (deviation) of crystal orientation within the crystal grain compared to the crystal grains constituting the conventional TiAlN layer. In other words, there are strains in the crystal grains. These strains contribute to improvement of hardness and toughness.

A preferable area ratio of crystal grains having the average crystal grain misorientation of 2° or more relative to the complex nitride or complex carbonitride layer is 45% to 70%. A more preferable area ratio of crystal grains having the average crystal grain misorientation of 2° or more relative to the complex nitride or complex carbonitride layer is 50% to 65%. An even more preferable area ratio of crystal grains having the average crystal grain misorientation of 2° or more relative to the complex nitride or complex carbonitride layer is 55% to 60%.

Lower and Upper Layers:

Essentially, a sufficient technical effect can be obtained by the complex nitride or complex carbonitride layer of the surface-coated cutting tool of the present invention. However, further more improved traits can be obtained by: providing the lower layer of a Ti compound layer, which is made of one or more layers of: a Ti carbide layer; a Ti nitride layer; a Ti carbonitride layer; a Ti oxycarbide layer; and a Ti oxycarbonitride layer, having the average total layer thickness of 0.1 μm to 20 μm; and/or providing the upper layer including at least an aluminum oxide layer having the average total layer thickness of 1 μm to 25 μm. In the case where the lower layer of a Ti compound layer, which is made of one or more layers of: a Ti carbide layer; a Ti nitride layer; a Ti carbonitride layer; a Ti oxycarbide layer; and a Ti oxycarbonitride layer, is provided, if the total average layer thickness of the lower layer were less than 0.1 μm, a sufficient effect of the lower layer would not be obtained. If it exceeded 20 μm, the crystal grains would become easy to coarsen; and chipping would likely occur. If the average total layer thickness of the upper layer including the aluminum oxide layer were less than 1 μm, a sufficient effect of the upper layer would not be obtained. On the other hand, if it exceeded 25 μm, the crystal grains would become easy to coarsen; and chipping would likely occur.

Crystal Structure of the Hard Coating Layer:

When the hard coating layer is a single phase of the cubic structure, the hard coating layer exhibits particularly excellent wear resistance. When the hard coating layer is not a single phase of the cubic structure, it is preferable that the phase of the Ti and Al complex nitride or complex carbonitride layer having the cubic structure occupies 70 area % or more of the hard coating layer. When the area % of the cubic crystal grains is less than 70%, wear resistance of the hard coating layer tends to be deteriorated. On the other hand, when the area % is 70% or more, the hard coating layer exhibits excellent chipping resistance and wear resistance. The area ratio of the cubic crystal grains constituting the complex nitride or complex carbonitride is obtained by: analyzing the hard coating layer at the interval of 0.1 μm, along the vertical cross-sectional direction with an electron beam backscattering analyzer; performing the measurement in the measurement range of 10 μm of the width and the layer thickness of the length, along the vertical cross-sectional direction in five different view fields; obtaining the total number of pixels belonging to the cubic crystal grains constituting the complex nitride or complex carbonitride layer; and basing on the ratio of the above-mentioned total number of pixels to the total number of measurement pixels of the five view fields on the hard coating layer.

Figure 2:
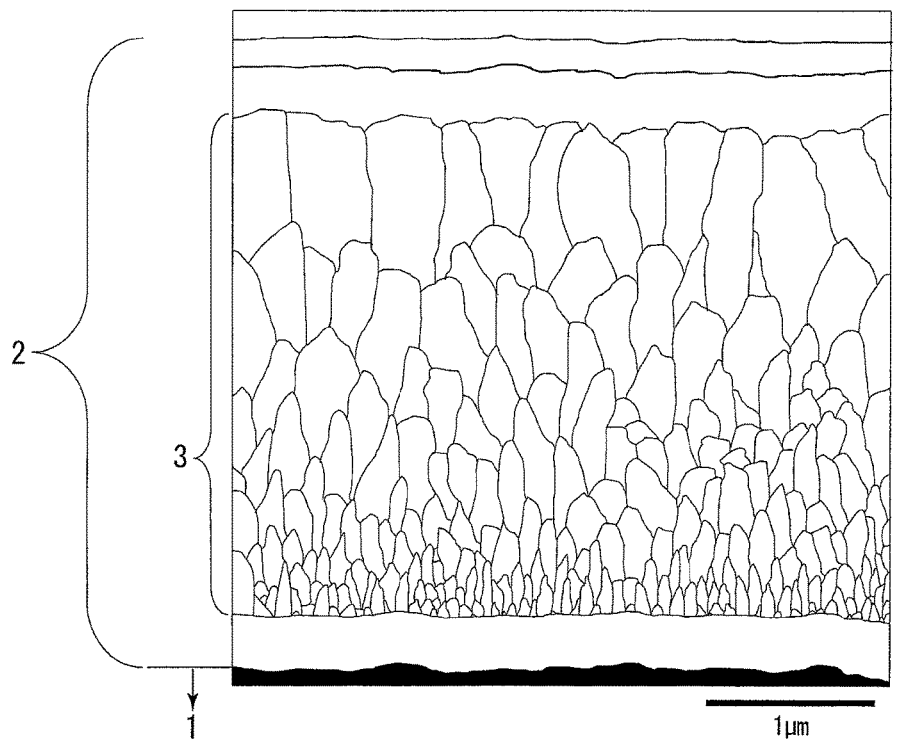
FIG. 2 is a schematic diagram of a film configuration showing the cross section of the Ti and Al complex nitride or complex carbonitride layer, which constitutes the hard coating layer of the surface-coated cutting tool of the present invention.

A schematic diagram of the cross section of the Ti and Al complex nitride or complex carbonitride layer constituting the hard coating layer of the surface-coated tool of the present invention is shown in FIG. 2.

Next, the coated tool of the present invention is explained with reference to Examples in detail.

Example 1

First, as raw material powders, the WC powder, the TiC powder, the TaC powder, the NbC powder, the $Cr_3C_2$ powder, and the Co powder, all of which had the average grain sizes of 1-3 μm, were prepared. Then, these raw material powders were blended in the blending composition shown in Table 1. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, the tool bodies A-C, which had the insert-shape defined by ISO-SEEN1203AFSN and made of WC-based cemented carbide, were produced.

In addition, as raw material powders, the TiCN powder (TiC/TiN=50/50 in mass ratio), the $Mo_2C$ powder, the ZrC powder, the NbC powder, the WC powder, the Co powder, and the Ni powders, all of which had the average grain sizes of 0.5-2 μm, were prepared. These raw material powders were blended in the blending composition shown in Table 2. Then, with a ball mill, the obtained mixtures were subjected to wet-mixing for 24 hours. After drying, the mixtures were press-molded into green compacts under pressure of 98 MPa. The obtained green compacts were sintered in the condition of: in nitrogen atmosphere of 1.3 kPa; at a temperature of 1500° C.; and for 1 hour of the retention time. After sintering, the tool body D, which had the insert-shape defined by ISO-SEEN1203AFSN and made of TiCN-based cermet, was produced.

Next, the coated tools of the present invention 1-15 were produced by forming the hard coating layers, which had the crystal grains having the cubic structure with the average crystal grain misorientation of 2° or more in the area ratios shown in Table 7, and were made of the $(Ti_{1-x}Al_x)(C_yN_{1-y})$ layers having the intended layer thicknesses shown in Table 7. The hard coating layers were formed by performing the thermal CVD method on the surfaces of the tool bodies A to D with a chemical vapor deposition apparatus in the forming conditions A to J shown in Tables 4 and 5 for a predetermined time. As the gas groups A and B, the gas group A made of $NH_3$ and $H_2$ included 2.0%-3.0% of $NH_3$ and 65%-75% of $H_2$; and the gas group B made of $TiCl_4$, $Al(CH_3)_3$, $AlCl_3$, $N_2$, and $H_2$ included: 0.6%-0.9% of $AlCl_3$, 0.2%-0.3% of $TiCl_4$, 0%-0.5% of $Al(CH_3)_3$, 12.5%-15.0% of $N_2$, and balance $H_2$. The pressure of the reaction atmosphere was 4.5 kPa-5.0 kPa. The temperature of the reaction atmosphere was 700° C.-900° C. As the way to supply each of the gas groups A and B, the supply period was 1 second to 5 seconds; the gas supply time per one period was 0.15 second to 0.25 second; and the phase difference of the gas supply of the gas groups A and B was 0.10 second to 0.20 second.

In regard to the coated tools 6 to 13 of the present invention, the lower layer shown in Table 6 and/or the upper layer shown in Table 7 were formed in the forming conditions shown in Table 3.

In addition, for a comparison purpose, the hard coating layers including at least the Ti and Al complex nitride or complex carbonitride layer were deposited on the surfaces of the tool bodies A to D, in the conditions shown in Tables 3 to 5 and in the intended layer thicknesses (μm) shown in Table 8 as in the coated tools of the present invention 1-15. At this time, the hard coating layers were formed in such a way that the reaction gas composition on the surfaces of the tool bodies were not changed during deposition of the $(Ti_{1-x}Al_x)(C_yN_{1-y})$ layer to produce the coated tools 1 to 13 of Comparative Examples.

In regard to coated tools 6-13 of Comparative Example, the lower layer shown in Table 6 and/or the upper layer shown in Table 8 were formed in the forming condition shown in Table 3, as in the coated tools 6 to 13 of the present invention.

For purpose of reference, the reference coated tools 14 and 15 shown in Table 8 were produced by depositing the $(Ti_{1-x}Al_x)(C_yN_{1-y})$ layers of the reference examples on the surfaces of the tool bodies B and D in the intended layer thicknesses with a standard physical vapor deposition by arc-ion plating.

The conditions for the arc-ion plating used for deposition in the reference example were as explained below.

(a) The tool bodies B and C were subjected to ultrasonic cleaning in acetone. Then, the cleaned tool bodies B and C in a dried state were set along the outer peripheral part in positions spaced away from the central axis in a predetermined distance in the radius direction on the rotating table in the arc-ion plating apparatus. As the cathode electrode (vaporization source), an Al—Ti alloy with a predetermined composition was placed.

(b) Inside of the apparatus was heated to 500° C. by a heater while retaining vacuum less than $10^{-2}$ Pa by exhausting atmosphere in the apparatus. Then, direct current bias voltage of −1000V was applied to the tool bodies rotating and orbiting on the rotation table. At the same time, arc discharge was generated by flowing current of 200 A between the cathode electrode made of the Al—Ti alloy and the anode electrode. By following the procedure described above, Al and Ti ions were formed in the apparatus to perform bombard cleaning on the surfaces of the tool bodies.

(c) Next, direct current bias voltage of −50V was applied to the tool bodies rotating and orbiting on the rotating table while turning the atmosphere in the apparatus to the reaction atmosphere of 4 Pa by introducing nitrogen gas as a reaction gas in the apparatus. At the same time, arc discharge was generated by flowing current of 120 A between the cathode electrode (vaporization source) made of the Al—Ti alloy and the anode electrode. By following above-described procedure, the (Ti, Al)N layers with the intended compositions and the intended average layer thicknesses shown in Table 7 were deposited on the surfaces of the tool bodies and the coated tools of the reference example 14 and 15 were produced.

The vertical cross sections to the tool bodies of each constituent layer of: the coated tools of the present invention 1-15; cutting tools 1-13 of Comparative Example; and the reference coated tools 14 and 15, were measured by using a scanning electron microscope (magnifying power: ×5000).

The average layer thicknesses were obtained by averaging layer thicknesses measured at 5 points within the observation viewing field. In any measurement, the obtained average layer thickness was practically the same as the intended layer thicknesses shown in Tables 6 to 8.

In regard to the average Al content ratio, $x_{avg}$, of the complex nitride layer or the complex carbonitride layer, an electron beam was irradiated to the samples by using EPMA (Electron-Probe-Micro-Analyser). Then, the average Al content ratio, $x_{avg}$, was obtained from 10-point average of the analysis results of the characteristic X-ray in the surface-polished samples. The average C content ratio, $y_{avg}$, was obtained by secondary-ion-mass-spectroscopy (SIMS). An ion beam was irradiated on the range of 70 μm×70 μm from the front surface side of the sample. In regard to the components released by sputtering effect, concentration measurement in the depth direction was performed. The average C content ratio, $y_{avg}$, indicates the average value in the depth direction of the Ti and Al complex nitride layer or complex carbonitride layer. In the C content ratio, the C content ratio inevitably included without intended usage of the gas including C as the gas raw material was excluded. More specifically, the content ratio of the C component (in the atomic ratio) in the complex nitride or complex carbonitride layer when the supply amount of $Al(CH_3)_3$ was set to 0 was obtained as the inevitable C content ratio. Then, the value of the content ratio of the C component (in the atomic ratio) in the complex nitride or complex carbonitride layer obtained when $Al(CH_3)_3$ was intentionally supplied subtracted by the above-described inevitable C component ratio was obtained as $y_{avg}$.

Then, crystal orientation of each of crystal grains having the cubic structure constituting the Ti and Al complex nitride or complex carbonitride layer, was analyzed along the vertical cross-sectional direction with an electron beam backscattering analyzer. When there was crystal misorientation of 5° or more between adjacent pixels, the mid-parting line was defined as the grain boundary, and the region surrounded by a single boundary was defined by one crystal grain. Then, the average crystal grain misorientation between a pixel in the crystal grain and all of other pixels in the same crystal grains was obtained. Mapping was performed by classing the obtained average crystal grain misorientation in every 1° in the range from 0° to 10°, such as: more than 0° to less than 1°; more than 1° to less than 2°; more than 2° to less than 3°; more than 3° to less than 4°; and the like. Based on the mapping diagram, the area ratio of the crystal grains having the average crystal grain misorientation of 2° or more occupying the entire Ti and Al complex nitride or complex carbonitride layer was obtained. The results are shown in Tables 7 and 8.

Figure 3:
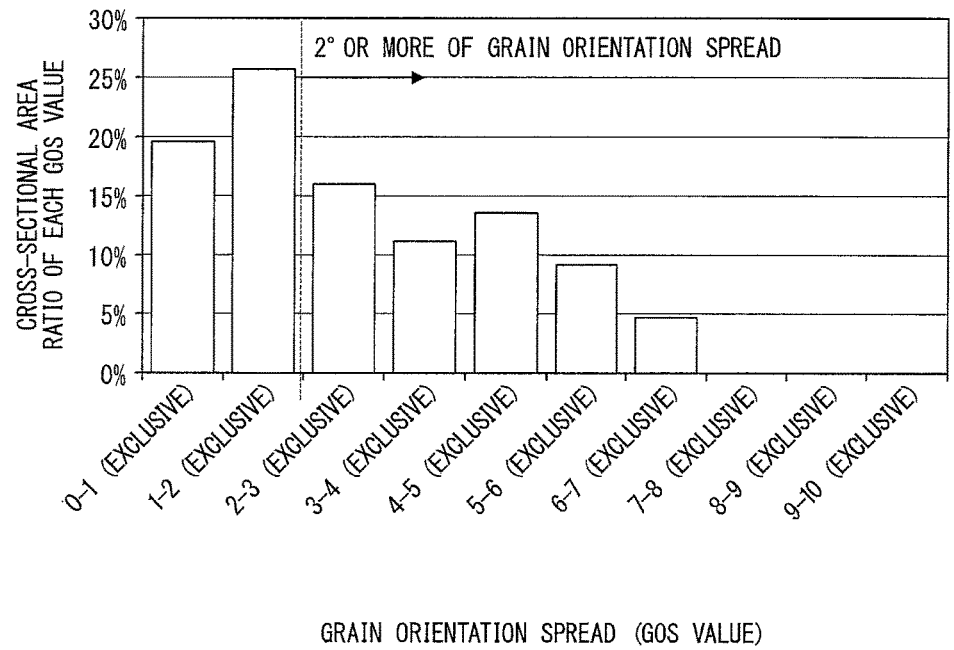
FIG. 3 shows an example of histogram of the area ratio of the average crystal grain misorientation (GOS value) in each of crystal grains having the cubic structure in a cross section of the Ti and Al complex nitride or complex carbonitride layer, which constitutes the hard coating layer of the coated tool 2 of the present invention, corresponding to an embodiment of the present invention. The vertical dotted line in the histogram indicates the boundary line where the average crystal grain misorientation is 2°. Thus, bars on the right side of the vertical dotted line in FIG. 3 correspond to crystal grains having the average crystal grain misorientation of 2° or more.
Figure 4:
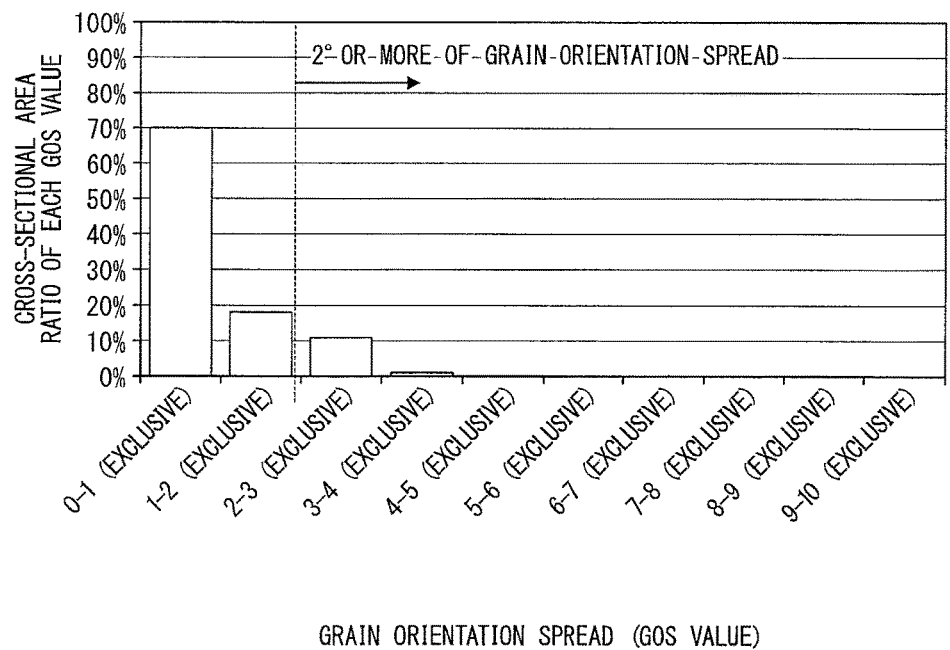
FIG. 4 shows an example of histogram of the area ratio of the average crystal grain misorientation (GOS value) in each of crystal grains having the cubic structure in a cross section of the Ti and Al complex nitride or complex carbonitride layer, which constitutes the hard coating layer of Comparative Coated Tool 2, corresponding to a coated tool of Comparative Example. The vertical dotted line in the histogram indicates the boundary line where the average crystal grain misorientation is 2°. Thus, bars on the right side of the vertical dotted line in FIG. 4 correspond to crystal grains having the average crystal grain misorientation of 2° or more.

An example of the histogram of the average crystal gain misorientation measured in the coated tool 2 of the present invention is shown in FIG. 3. In addition, an example of the histogram of the average crystal gain misorientation measured in the coated tool 2 of Comparative Example is shown in FIG. 4.

TABLE 1

| | | Blending composition (mass %) | | | | | |
|---|---|---|---|---|---|---|---|
| Type | | Co | TiC | TaC | NbC | $Cr_3C_2$ | WC |
| Tool body | A | 8.0 | 1.5 | — | 3.0 | 0.4 | balance |
| | B | 8.5 | — | 1.8 | 0.2 | — | balance |
| | C | 7.0 | — | — | — | — | balance |

TABLE 2

| Type | | Blending composition (mass %) | | | | | | |
|---|---|---|---|---|---|---|---|---|
| | | Co | Ni | ZrC | NbC | Mo$_2$C | WC | TiCN |
| Tool body | D | 8 | 5 | 1 | 6 | 6 | 10 | balance |

TABLE 3

| Layer constituting the hard coating layer | | | Forming condition (pressure and temperature of the reaction atmosphere are shown as kPa and ° C., respectively) | | |
|---|---|---|---|---|---|
| Type | | Formation symbol | Reaction gas composition | Reaction atmosphere Pressure | Temperature |
| $(Ti_{1-x}Al_x)(C_yN_{1-y})$ layer | TiAlCN | TiAlCN | Refer Table 4 | | |
| Ti compound layer | TiC | TiC | TiCl$_4$: 4.2%, CH$_4$: 8.5%, H$_2$: balance | 7 | 1020 |
| | TiN | TiN-1 | TiCl$_4$: 4.2%, N$_2$: 30%, H$_2$: balance | 30 | 900 |
| | | TiN-2 | TiCl$_4$: 4.2%, N$_2$: 35%, H$_2$: balance | 50 | 950 |
| | | TiN-3 | TiCl$_4$: 4.2%, N$_2$: 30%, H$_2$: balance | 30 | 780 |
| | l-TiCN | l-TiCN-1 | TiCl$_4$: 2%, CH$_3$CN: 0.7%, N$_2$: 10%, H$_2$: balance | 7 | 900 |
| | | l-TiCN-2 | TiCl$_4$: 2%, CH$_3$CN: 0.7%, N$_2$: 10%, H$_2$: balance | 7 | 780 |
| | TiCN | TiCN | TiCl$_4$: 2%, CH$_4$: 1%, N$_2$: 15%, H$_2$: balance | 13 | 950 |
| | TiCO | TiCO | TiCl$_4$: 4.2%, CO: 4%, H$_2$: balance | 7 | 950 |
| | TiCNO | TiCNO | TiCl$_4$: 2%, CO: 1%, CH$_4$: 1%, N$_2$: 5%, H$_2$: balance | 13 | 950 |
| Al$_2$O$_3$ layer | Al$_2$O$_3$ | Al$_2$O$_3$ | AlCl$_3$: 2.2%, CO$_2$: 5.5%, HCl: 2.2%, H$_2$S: 0.2%, H$_2$: balance | 7 | 950 |

TABLE 4

| Formation of the hard coating layer | | Forming condition (The reaction gas composition indicates the ratio to the sum of gas groups A and B) | |
|---|---|---|---|
| Process type | Formation symbol | Reaction gas composition of the gas group A (volume %) | Reaction gas composition of the gas group B (volume %) |
| Deposition process in the present invention | A | NH$_3$: 2.5%, H$_2$: 70% | AlCl$_3$: 0.7%, TiCl$_4$: 0.2%, N$_2$: 13%, Al(CH$_3$)$_3$: 0%, H$_2$: balance |
| | B | NH$_3$: 3.0%, H$_2$: 75% | AlCl$_3$: 0.7%, TiCl$_4$: 0.3%, N$_2$: 15%, Al(CH$_3$)$_3$: 0%, H$_2$: balance |
| | C | NH$_3$: 2.0%, H$_2$: 65% | AlCl$_3$: 0.9%, TiCl$_4$: 0.3%, N$_2$: 14%, Al(CH$_3$)$_3$: 0.5%, H$_2$: balance |
| | D | NH$_3$: 3.0%, H$_2$: 70% | AlCl$_3$: 0.6%, TiCl$_4$: 0.2%, N$_2$: 12.5%, Al(CH$_3$)$_3$: 0%, H$_2$: balance |
| | E | NH$_3$: 2.0%, H$_2$: 75% | AlCl$_3$: 0.8%, TiCl$_4$: 0.3%, N$_2$: 13%, Al(CH$_3$)$_3$: 0%, H$_2$: balance |
| | F | NH$_3$: 2.5%, H$_2$: 65% | AlCl$_3$: 0.7%, TiCl$_4$: 0.3%, N$_2$: 14.5%, Al(CH$_3$)$_3$: 0.2%, H$_2$: balance |
| | G | NH$_3$: 2.5%, H$_2$: 70% | AlCl$_3$: 0.6%, TiCl$_4$: 0.2%, N$_2$: 13.5%, Al(CH$_3$)$_3$: 0%, H$_2$: balance |
| | H | NH$_3$: 2.5%, H$_2$: 70% | AlCl$_3$: 0.9%, TiCl$_4$: 0.2%, N$_2$: 12.8%, Al(CH$_3$)$_3$: 0%, H$_2$: balance |
| | I | NH$_3$: 2.5%, H$_2$: 70% | AlCl$_3$: 0.6%, TiCl$_4$: 0.3%, N$_2$: 13.5%, Al(CH$_3$)$_3$: 0.4%, H$_2$: balance |
| | J | NH$_3$: 2.5%, H$_2$: 70% | AlCl$_3$: 0.8%, TiCl$_4$: 0.3%, N$_2$: 14%, Al(CH$_3$)$_3$: 0%, H$_2$: balance |
| Deposition process in Comparative Example | A' | NH$_3$: 2.5%, H$_2$: 70% | AlCl$_3$: 0.7%, TiCl$_4$: 0.2%, N$_2$: 13%, Al(CH$_3$)$_3$: 0%, H$_2$: balance |
| | B' | NH$_3$: 3.0%, H$_2$: 75% | AlCl$_3$: 0.7%, TiCl$_4$: 0.3%, N$_2$: 15%, Al(CH$_3$)$_3$: 0%, H$_2$: balance |
| | C' | NH$_3$: 2.0%, H$_2$: 65% | AlCl$_3$: 0.9%, TiCl$_4$: 0.3%, N$_2$: 14%, Al(CH$_3$)$_3$: 0.5%, H$_2$: balance |
| | D' | NH$_3$: 3.0%, H$_2$: 70% | AlCl$_3$: 0.6%, TiCl$_4$: 0.2%, N$_2$: 12.5%, Al(CH$_3$)$_3$: 0%, H$_2$: balance |
| | E' | NH$_3$: 2.0%, H$_2$: 75% | AlCl$_3$: 0.8%, TiCl$_4$: 0.3%, N$_2$: 13%, Al(CH$_3$)$_3$: 0%, H$_2$: balance |
| | F' | NH$_3$: 2.5%, H$_2$: 65% | AlCl$_3$: 0.7%, TiCl$_4$: 0.3%, N$_2$: 14.5%, Al(CH$_3$)$_3$: 0.2%, H$_2$: balance |
| | G' | NH$_3$: 2.5%, H$_2$: 70% | AlCl$_3$: 0.6%, TiCl$_4$: 0.2%, N$_2$: 13.5%, Al(CH$_3$)$_3$: 0%, H$_2$: balance |
| | H' | NH$_3$: 2.5%, H$_2$: 70% | AlCl$_3$: 0.9%, TiCl$_4$: 0.2%, N$_2$: 12.8%, Al(CH$_3$)$_3$: 0%, H$_2$: balance |
| | I' | NH$_3$: 2.5%, H$_2$: 70% | AlCl$_3$: 0.6%, TiCl$_4$: 0.3%, N$_2$: 13.5%, Al(CH$_3$)$_3$: 0.4%, H$_2$: balance |
| | J' | NH$_3$: 2.5%, H$_2$: 70% | AlCl$_3$: 0.8%, TiCl$_4$: 0.3%, N$_2$: 14%, Al(CH$_3$)$_3$: 0%, H$_2$: balance |

TABLE 5

| Formation of the hard coating layer | | Gas group A | | Gas group B | | Phase difference between the | Reaction atmosphere | |
|---|---|---|---|---|---|---|---|---|
| Process type | Formation symbol | Supply period (second) | Supply time per one period (second) | Supply period (second) | Supply time per one period (second) | gas groups A and B (second) | Pressure | Temperature |
| Deposition process in the present invention | A | 1 | 0.2 | 1 | 0.2 | 0.1 | 4.7 | 800 |
| | B | 3 | 0.15 | 3 | 0.15 | 0.15 | 4.5 | 800 |
| | C | 2 | 0.25 | 2 | 0.25 | 0.2 | 5 | 700 |
| | D | 5 | 0.2 | 5 | 0.2 | 0.1 | 4.7 | 800 |
| | E | 4 | 0.2 | 4 | 0.2 | 0.15 | 5 | 850 |
| | F | 2.5 | 0.2 | 2.5 | 0.2 | 0.2 | 4.5 | 800 |
| | G | 1.5 | 0.15 | 1.5 | 0.15 | 0.2 | 4.7 | 700 |
| | H | 1.2 | 0.25 | 1.2 | 0.25 | 0.1 | 4.7 | 900 |
| | I | 4.5 | 0.2 | 4.5 | 0.2 | 0.15 | 4.7 | 800 |
| | J | 2.5 | 0.2 | 2.5 | 0.2 | 0.2 | 4.7 | 750 |
| Deposition process in Comparative Example | A' | — | — | — | — | — | 4.7 | 800 |
| | B' | — | — | — | — | — | 4.5 | 800 |
| | C' | — | — | — | — | — | 5 | 700 |
| | D' | — | — | — | — | — | 4.7 | 800 |
| | E' | — | — | — | — | — | 5 | 850 |
| | F' | — | — | — | — | — | 4.5 | 800 |
| | G' | — | — | — | — | — | 4.7 | 700 |
| | H' | — | — | — | — | — | 4.7 | 900 |
| | I' | — | — | — | — | — | 4.7 | 800 |
| | J( | — | — | — | — | — | 4.7 | 750 |

Forming condition (Pressure and temperature of the reaction atmosphere are shown as kPa and °C., respectively)

TABLE 6

| Type | Tool body symbol | Hard coating layer Lower layer | | |
|---|---|---|---|---|
| | | 1st layer | 2nd layer | 3rd layer |
| Coated tool of the present invention, coated tool of Comparative Example, and reference coated tool | 1 A | — | — | — |
| | 2 B | — | — | — |
| | 3 C | — | — | — |
| | 4 D | — | — | — |
| | 5 A | — | — | — |
| | 6 B | TiC (0.5) | — | — |
| | 7 C | TiN-1 (0.3) | — | — |
| | 8 D | TiN-1 (0.5) | 1-TiCN-1 (4) | — |
| | 9 A | TiN-1 (0.3) | 1-TiCN-1 (2) | TiCN (0.7) |
| | 10 B | — | — | — |
| | 11 C | TiN-1 (0.5) | — | — |
| | 12 D | TiC (1) | — | — |
| | 13 A | TiN-1 (0.1) | — | — |
| | 14 B | — | — | — |
| | 15 C | — | — | — |

(the number at the bottom indicates the intended average layer thickness (μm) of the layer)

TABLE 7

| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | Upper layer (Numbers at the bottom indicate the average intended layer thickness (μm) of the layer) 1st layer | 2nd layer |
|---|---|---|---|---|---|---|---|---|---|
| Coated tool of the present invention | 1 A | A | 0.95 | less than 0.0001 | 58 | 100 | 5 | — | — |
| | 2 B | B | 0.76 | less than 0.0001 | 56 | 100 | 6 | — | — |
| | 3 C | C | 0.79 | 0.0015 | 40 | 100 | 1 | — | — |
| | 4 D | D | 0.75 | less than 0.0001 | 67 | 100 | 8 | — | — |
| | 5 A | E | 0.93 | less than 0.0001 | 45 | 85 | 3 | — | — |
| | 6 B | F | 0.67 | 0.0028 | 56 | 100 | 4 | — | — |
| | 7 C | G | 0.83 | less than 0.0001 | 64 | 100 | 6 | — | — |
| | 8 D | H | 0.93 | less than 0.0001 | 43 | 72 | 2 | — | — |
| | 9 A | I | 0.68 | 0.0046 | 54 | 100 | 7 | — | — |
| | 10 B | J | 0.60 | less than 0.0001 | 68 | 98 | 5 | Al$_2$O$_3$ (2.5) | — |
| | 11 C | A | 0.95 | less than 0.0001 | 72 | 99 | 4 | TiCN (0.5) | Al$_2$O$_3$ (3) |
| | 12 D | B | 0.76 | less than 0.0001 | 64 | 96 | 3 | TiCO (1) | Al$_2$O$_3$ (2) |
| | 13 A | C | 0.79 | 0.0018 | 51 | 97 | 1 | TiCNO (0.3) | Al$_2$O$_3$ (1) |
| | 14 B | D | 0.75 | less than 0.0001 | 49 | 100 | 10 | — | — |
| | 15 C | E | 0.93 | less than 0.0001 | 63 | 83 | 3 | — | — |

TABLE 8

| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | Upper layer (Numbers at the bottom indicate the average intended layer thickness (μm) of the layer) 1st layer | 2nd layer |
|---|---|---|---|---|---|---|---|---|---|
| Coated tool of Comparative Example | 1 A | A' | 0.92 | less than 0.0001 | 9 | 100 | 5 | — | — |
| | 2 B | B' | 0.78 | less than 0.0001 | 12 | 100 | 6 | — | — |
| | 3 C | C' | 0.82 | 0.0016 | 0 | 100 | 1 | — | — |
| | 4 D | D' | 0.73 | less than 0.0001 | 15 | 100 | 8 | — | — |
| | 5 A | E' | 0.92 | less than 0.0001 | 4 | 81 | 3 | — | — |
| | 6 B | F' | 0.69 | 0.0024 | 7 | 100 | 4 | — | — |
| | 7 C | G' | 0.81 | less than 0.0001 | 8 | 100 | 6 | — | — |
| | 8 D | H' | 0.89 | less than 0.0001 | 2 | 70 | 2 | — | — |
| | 9 A | I' | 0.65 | 0.0043 | 5 | 100 | 7 | — | — |
| | 10 B | J' | 0.60 | less than 0.0001 | 11 | 99 | 5 | Al$_2$O$_3$ (2.5) | — |
| | 11 C | A' | 0.93 | less than 0.0001 | 14 | 98 | 4 | TiCN (0.5) | Al$_2$O$_3$ (3) |
| | 12 D | B' | 0.79 | less than 0.0001 | 17 | 96 | 3 | TiCO (1) | Al$_2$O$_3$ (2) |

TABLE 8-continued

| | | | Hard coating layer | | | | | | |
|---|---|---|---|---|---|---|---|---|---|
| | | | Ti and Al complex nitride, carbonitride layer $(Ti_{1-x}Al_x)(C_yN_{1-y})$ | | | | | Upper layer | |
| | | Tool | Formation symbol of TiAlCN deposition | Al content | C content | Area ratio of crystal grains having the average crystal grain | Area ratio of the cubic | Intended layer | (Numbers at the bottom indicate the average intended layer thickness (μm) of the layer) | |
| Type | | body symbol | process (refer Tables 4 and 5) | ratio x | ratio y | misorientation of 2° or more (%) | crystals (%) | thickness (μm) | 1st layer | 2nd layer |
| | 13 | A | C' | 0.81 | 0.0021 | 5 | 98 | 1 | TiCNO (0.3) | $Al_2O_3$ (1) |
| Reference coated tool | 14 | B | AIP | 0.50 | less than 0.0001 | 1 | 100 | 5 | — | — |
| | 15 | C | AIP | 0.59 | less than 0.0001 | 2 | 100 | 3 | — | — |

"AIP" indicates deposition by using the arc ion plating.

Next, each of the coated tools described above was clamped on the face milling cutter made of tool steel with the cutter diameter of 125 mm by a fixing jig. Then, the center cut cutting test of high speed dry face milling was performed on the coated tools of the present invention 1-13; the coated tools 1-8 and 11-15 of Comparative Example; and the reference coated tools 14 and 15, in the clamped-state. The center cut cutting test of high speed dry face milling is a type of high speed intermittent cutting of alloy steel, and was performed under the condition shown below. After the test, width of flank wear of the cutting edge was measured. Results are shown in Table 9.

Tool body: Tungsten carbide-based cemented carbide; Titanium carbonitride-based cermet Cutting test: High speed dry face milling; Center cut cutting test Work: Block material of JIS-SCM440 standard having width of 100 mm and length of 400 mm Rotation speed: 968 $min^{-1}$ Cutting speed: 380 m/min Cutting depth: 1.2 mm Feed rate per tooth: 0.1 mm/tooth Cutting time: 8 minutes

TABLE 9

| Type | | Width of flank wear (mm) | Type | | Cutting test result (minute) |
|---|---|---|---|---|---|
| Coated tool of the present invention | 1 | 0.09 | Coated tool of Comparative Example | 1 | 4.2* |
| | 2 | 0.10 | | 2 | 3.2* |
| | 3 | 0.07 | | 3 | 3.4* |
| | 4 | 0.14 | | 4 | 2.2* |
| | 5 | 0.08 | | 5 | 4.6* |
| | 6 | 0.12 | | 6 | 3.7* |
| | 7 | 0.09 | | 7 | 4.4* |
| | 8 | 0.12 | | 8 | 2.3* |
| | 9 | 0.11 | | 9 | 3.6* |
| | 10 | 0.09 | | 10 | 4.3* |
| | 11 | 0.09 | | 11 | 4.8* |
| | 12 | 0.13 | | 12 | 2.3* |
| | 13 | 0.11 | | 13 | 4.0* |
| | 14 | 0.11 | Reference coated tool | 14 | 1.8* |
| | 15 | 0.08 | | 15 | 1.6* |

Asterisk marks (*) in the column of coated tools of Comparative Example and reference coated tools indicate cutting time (min) until they reached to their service lives due to occurrence of chipping.

Example 2

First, as raw material powders, the WC powder, the TiC powder, the ZrC powder, the TaC powder, the NbC powder, the $Cr_3C_2$ powder, the TiN powder, and the Co powder, all of which had the average grain sizes of 1-3 μm, were prepared. Then, these raw material powders were blended in the blending composition shown in Table 10. Then, wax was added to the blended mixture, and further mixed in acetone for 24 hours with a ball mill. After drying under reduced pressure, the mixtures were press-molded into green compacts with a predetermined shape under pressure of 98 MPa. Then, the obtained green compacts were sintered in vacuum in the condition of 5 Pa vacuum at the predetermined temperature in the range of 1370-1470° C. for 1 hour retention. After sintering, by performing honing work of R: 0.07 mm on their cutting edge parts, the tool bodies α-γ, which had the insert-shape defined by ISO-CNMG120412 and made of WC-based cemented carbide, were produced.

In addition, as raw material powders, the TiCN powder (TiC/TiN=50/50 in mass ratio), the NbC powder, the WC powder, the Co powder, and the Ni powders, all of which had the average grain sizes of 0.5-2 μm, were prepared. These raw material powders were blended in the blending composition shown in Table 11. Then, with a ball mill, the obtained mixtures were subjected to wet-mixing for 24 hours. After drying, the mixtures were press-molded into green compacts under pressure of 98 MPa. The obtained green compacts were sintered in the condition of: in nitrogen atmosphere of 1.3 kPa; at a temperature of 1500° C.; and for 1 hour of the retention time. After sintering, by performing honing work of R: 0.07 mm on their cutting edge parts, the tool body δ, which had the insert-shape defined by ISO-CNMG120412 and made of TiCN-based cermet, was produced.

Next, the coated tools of the present invention 16-30 shown in Table 12 were produced by depositing the hard coating layers including at least the $(Ti_{1-x}Al_x)(C_yN_{1-y})$ layer in the intended layer thicknesses on the surfaces of the tool bodies α-γ and the tool body δ in the conditions shown in Tables 3 to 5 with a chemical vapor deposition apparatus in the same manner as Example 1.

In regard to the coated tools 19 to 28 of the present invention, the lower layer shown in Table 12 and/or the upper layer shown in Table 13 were formed in the forming conditions shown in Table 3.

In addition, for a comparison purpose, the coated tools 16 to 28 shown in Table 14 of Comparative Example were produced by depositing the hard coating layers on the surfaces of the tool bodies α-γ and the tool body δ with a chemical vapor deposition apparatus, in the conditions shown in Tables 3 to 5 and in the intended layer thicknesses shown in Table 14 in the same manner as the coated tools of the present invention.

In regard to coated tools 19-28 of Comparative Example, the lower layer shown in Table 12 and/or the upper layer shown in Table 14 were formed in the forming condition shown in Table 3, as in the coated tools 19 to 28 of the present invention.

For purpose of reference, the reference coated tools 29 and 30 shown in Table 14 were produced by depositing the $(Ti_{1-x}Al_x)(C_yN_{1-y})$ layers of the reference examples on the surfaces of the tool bodies β and γ in the intended layer thicknesses with a standard physical vapor deposition by arc-ion plating.

The conditions for the arc-ion plating used for deposition in the reference example were as in Example 1.

The cross sections of each constituent layer of: the coated tools of the present invention 16 to 30; cutting tools 16-28 of Comparative Example; and the reference coated tools 29 and 30, were measured by using a scanning electron microscope (magnifying power: ×5000). The average layer thicknesses were obtained by averaging layer thicknesses measured at 5 points within the observation viewing field. In any measurement, the obtained average layer thickness was practically the same as the intended layer thicknesses shown in Tables 12 to 14.

Then, crystal orientation of each of crystal grains having the cubic structure constituting the Ti and Al complex nitride or complex carbonitride layer, was analyzed along the vertical cross-sectional direction with an electron beam backscattering analyzer. Mapping was performed by classing the obtained average crystal grain misorientation in every 1° in the range from 0° to 10°, such as: more than 0° to less than 1°; more than 1° to less than 2°; more than 2° to less than 3°; more than 3° to less than 4°; and the like. Based on the mapping diagram, the area ratio of the crystal grains having the average crystal grain misorientation of 2° or more occupying the entire Ti and Al complex nitride or complex carbonitride layer was obtained. The results are shown in Tables 13 and 14.

TABLE 10

| Type | | Blending composition (mass %) | | | | | | |
|---|---|---|---|---|---|---|---|---|
| | | Co | TiC | ZrC | TaC | NbC | $Cr_3C_2$ | TiN | WC |
| Tool body | α | 6.5 | — | 1.5 | — | 2.9 | 0.1 | 1.5 | balance |
| | β | 7.6 | 2.6 | — | 4.0 | 0.5 | — | 1.1 | balance |
| | γ | 6.0 | — | — | — | — | — | — | balance |

TABLE 11

| Type | | Blending composition (mass %) | | | | |
|---|---|---|---|---|---|---|
| | | Co | Ni | NbC | WC | TiCN |
| Tool body | δ | 11 | 4 | 6 | 15 | balance |

TABLE 12

| | | Hard coating layer (the number at the bottom indicates the intended average layer thickness (μm) of the layer) | | | |
|---|---|---|---|---|---|
| | Tool | Lower layer | | | |
| Type | body symbol | 1st layer | 2nd layer | 3rd layer | 4th layer |
| Coated tool of the present invention, coated tool of Comparative Example, and reference coated tool | 16 α | — | — | — | — |
| | 17 β | — | — | — | — |
| | 18 γ | — | — | — | — |
| | 19 δ | TiC (0.5) | — | — | — |
| | 20 α | TiN-1 (0.1) | — | — | — |
| | 21 β | TiN-1 (0.5) | 1-TiCN-1 (7) | — | — |
| | 22 γ | TiN-1 (0.3) | 1-TiCN-1 (10) | TiN-2 (0.7) | — |
| | 23 δ | TiN-1 (0.3) | 1-TiCN-1 (4) | TiCN (0.4) | TiN-2 (0.3) |
| | 24 α | — | — | — | — |
| | 25 β | TiN-1 (0.5) | — | — | — |
| | 26 γ | TiC (1) | — | — | — |
| | 27 δ | TiN-1 (0.1) | — | — | — |
| | 28 α | TiN-1 (0.1) | — | — | — |
| | 29 β | — | — | — | — |
| | 30 γ | — | — | — | — |

TABLE 13

| | | | Hard coating layer | | | | | | | | |
|---|---|---|---|---|---|---|---|---|---|---|---|
| | | | Ti and Al complex nitride, carbonitride layer $(Ti_{1-x}Al_x)(C_yN_{1-y})$ | | | | | Upper layer | | | |
| | | | | | | | | (Numbers at the bottom indicate the average intended layer thickness (μm) of the layer) | | | |
| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | 1st layer | 2nd layer | 3rd layer | 4th layer |
| Coated tool of the present invention | 16 α | A | 0.95 | less than 0.0001 | 49 | 100 | 6 | — | — | — | — |
| | 17 β | B | 0.76 | less than 0.0001 | 56 | 100 | 2 | — | — | — | — |
| | 18 γ | C | 0.79 | 0.0019 | 40 | 100 | 7 | — | — | — | — |
| | 19 δ | D | 0.75 | less than 0.0001 | 71 | 100 | 12 | — | — | — | — |
| | 20 α | E | 0.93 | less than 0.0001 | 62 | 79 | 16 | — | — | — | — |
| | 21 β | F | 0.67 | 0.0029 | 47 | 100 | 8 | — | — | — | — |
| | 22 γ | G | 0.83 | less than 0.0001 | 58 | 95 | 20 | TiN-2 (0.7) | — | — | — |
| | 23 δ | H | 0.93 | less than 0.0001 | 63 | 72 | 15 | TiCN (0.4) | TiN-2 (0.3) | — | — |
| | 24 α | I | 0.68 | 0.0039 | 68 | 96 | 3 | Al$_2$O$_3$ (2) | — | — | — |
| | 25 β | J | 0.60 | less than 0.0001 | 57 | 95 | 7 | TiCN (0.5) | Al$_2$O$_3$ (2.5) | — | — |
| | 26 γ | A | 0.95 | less than 0.0001 | 43 | 98 | 4 | TiCO (1) | Al$_2$O$_3$ (2) | — | — |
| | 27 δ | B | 0.76 | less than 0.0001 | 58 | 96 | 11 | TiCNO (0.3) | Al$_2$O$_3$ (1) | — | — |
| | 28 α | C | 0.79 | 0.0017 | 46 | 93 | 5 | TiN-2 (0.3) | TiCN (0.8) | TiCNO (0.3) | Al$_2$O$_3$ (3) |
| | 29 β | D | 0.75 | less than 0.0001 | 63 | 100 | 16 | — | — | — | — |
| | 30 γ | E | 0.93 | less than 0.0001 | 55 | 83 | 9 | — | — | — | — |

TABLE 14

| | | | Hard coating layer | | | | | | | | |
|---|---|---|---|---|---|---|---|---|---|---|---|
| | | | Ti and Al complex nitride, carbonitride layer $(Ti_{1-x}Al_x)(C_yN_{1-y})$ | | | | | Upper layer | | | |
| | | | | | | | | (Numbers at the bottom indicate the average intended layer thickness (μm) of the layer) | | | |
| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | 1st layer | 2nd layer | 3rd layer | 4th layer |
| Coated tool of Comparative Example | 16 α | A' | 0.92 | less than 0.0001 | 4 | 100 | 6 | — | — | — | — |
| | 17 β | B' | 0.78 | less than 0.0001 | 7 | 100 | 2 | — | — | — | — |
| | 18 γ | C' | 0.82 | 0.0023 | 0 | 100 | 7 | — | — | — | — |
| | 19 δ | D' | 0.73 | less than 0.0001 | 13 | 100 | 12 | — | — | — | — |
| | 20 α | E' | 0.92 | less than 0.0001 | 9 | 76 | 16 | — | — | — | — |
| | 21 β | F' | 0.69 | 0.0036 | 4 | 100 | 8 | — | — | — | — |
| | 22 γ | G' | 0.81 | less than 0.0001 | 9 | 96 | 20 | TiN-2 (0.7) | — | — | — |
| | 23 δ | H' | 0.89 | less than 0.0001 | 15 | 68 | 15 | TiCN (0.4) | TiN-2 (0.3) | — | — |
| | 24 α | I' | 0.65 | 0.0044 | 7 | 98 | 3 | Al$_2$O$_3$ (2) | — | — | — |
| | 25 β | J' | 0.60 | less than 0.0001 | 12 | 93 | 7 | TiCN (0.5) | Al$_2$O$_3$ (2.5) | — | — |
| | 26 γ | A' | 0.93 | less than 0.0001 | 2 | 99 | 4 | TiCO (1) | Al$_2$O$_3$ (2) | — | — |

TABLE 14-continued

| | | | Hard coating layer | | | | | | | | |
|---|---|---|---|---|---|---|---|---|---|---|---|
| | | | Ti and Al complex nitride, carbonitride layer $(Ti_{1-x}Al_x)(C_yN_{1-y})$ | | | | | Upper layer | | | |
| | | | | | | | | (Numbers at the bottom indicate the average intended layer thickness (μm) of the layer) | | | |
| | Tool | Formation symbol of TiAlCN deposition | Al content | C content | Area ratio of crystal grains having the average crystal grain | Area ratio of the cubic | Intended layer | | | | |
| Type | body symbol | process (refer Tables 4 and 5) | ratio x | ratio y | misorientation of 2° or more (%) | crystals (%) | thickness (μm) | 1st layer | 2nd layer | 3rd layer | 4th layer |
| | 27 δ | B' | 0.79 | less than 0.0001 | 7 | 95 | 11 | TiCNO (0.3) | $Al_2O_3$ (1) | — | — |
| | 28 α | C' | 0.81 | 0.0018 | 3 | 94 | 5 | TiN-2 (0.3) | TiCN (0.8) | TiCNO (0.3) | $Al_2O_3$ (3) |
| Reference coated tool | 29 β | AIP | 0.50 | less than 0.0001 | 2 | 100 | 16 | — | — | — | — |
| | 30 γ | AIP | 0.59 | less than 0.0001 | 3 | 100 | 9 | — | — | — | — |

"AIP" indicates deposition by using the arc ion plating.

Next, each coated tool described above was screwed on the tip of the insert holder made of tool steel by a fixing jig. Then, the dry high speed intermittent cutting test of carbon steel and the wet high speed intermittent cutting test of cast iron explained below were performed on the coated tools of the present invention 16-30; the coated tools 16-28 of Comparative Example; and the reference coated tools 29 and 30. After the tests, width of flank wear of the cutting edge was measured in each test.

Cutting condition 1:
Work: Round bar in JIS-S45C standard with 4 evenly spaced slits in the longitudinal direction
Cutting speed: 370 m/min.
Cutting depth: 1.2 mm
Feed rate: 0.2 mm/rev.
Cutting time: 5 minutes
(the normal cutting speed is 220 m/min)
Cutting condition 2:
Work: Round bar in JIS-FCD700 standard with 4 evenly spaced slits in the longitudinal direction
Cutting speed: 320 m/min.
Cutting depth: 1.2 mm
Feed rate: 0.1 mm/rev.
Cutting time: 5 minutes
(the normal cutting speed is 180 m/min)
Results of the cutting test are shown in Table 15.

TABLE 15

| | Width of flank wear (mm) | | | | Cutting test result (minute) | |
|---|---|---|---|---|---|---|
| Type | | Cutting condition 1 | Cutting condition 2 | Type | Cutting condition 1 | Cutting condition 2 |
| Coated tool of the present invention | 16 | 0.20 | 0.23 | Coated tool of Comparative Example | 16 | 3.1* | 4.1* |
| | 17 | 0.22 | 0.24 | | 17 | 3.8* | 3.1* |
| | 18 | 0.25 | 0.23 | | 18 | 3.9* | 4.7* |
| | 19 | 0.22 | 0.13 | | 19 | 4.5* | 4.8* |
| | 20 | 0.22 | 0.10 | | 20 | 2.3* | 2.1* |
| | 21 | 0.20 | 0.22 | | 21 | 4.2* | 2.0* |
| | 22 | 0.25 | 0.21 | | 22 | 1.9* | 4.5* |
| | 23 | 0.23 | 0.22 | | 23 | 3.1* | 3.1* |
| | 24 | 0.10 | 0.26 | | 24 | 4.7* | 3.8* |
| | 25 | 0.26 | 0.23 | | 25 | 4.8* | 3.9* |
| | 26 | 0.23 | 0.22 | | 26 | 4.3* | 4.5* |
| | 27 | 0.22 | 0.22 | | 27 | 2.9* | 2.3* |
| | 28 | 0.21 | 0.22 | | 28 | 4.8* | 4.2* |
| | 29 | 0.22 | 0.20 | Reference coated tool | 29 | 2.1* | 1.9* |
| | 30 | 0.12 | 0.25 | | 30 | 2.0* | 1.8* |

Asterisk marks (*) in the column of coated tools of Comparative Example and reference coated tools indicate cutting time (min) until they reached to their service lives due to occurrence of chipping.

Example 3

First, as raw material powders, the cBN powder, the TiN powder, the TiC powder, the Al powder, and the $Al_2O_3$ powder, all of which had the average grain sizes of 0.5-4 μm, were prepared. Then, these raw material powders were blended in the blending composition shown in Table 16. Then, the blended mixtures were wet-mixed for 80 hours with a ball mill. After drying, the mixtures were press-molded into green compacts having the dimension of: 50 mm of the diameter and 1.5 mm of the thickness under pressure of 120 MPa. Then, the obtained green compacts were sintered in vacuum in the condition of 1 Pa vacuum at the predetermined temperature in the range of 900-1300° C. for 60 minutes retention to obtain preliminary sintered bodies for the cutting edge pieces. The obtained preliminary sintered bodies were placed on separately prepared supporting pieces made of WC-based cemented carbide, which had the composition of: 8 mass % of Co; and the WC balance, and the dimension of: 50 mm of the diameter; and 2 mm of the thickness. They were inserted into a standard ultra-high pressure sintering apparatus in the stacked state. Then, they were subjected to ultra-high-pressure sintering in the standard condition of: 4 GPa of pressure; a predetermined temperature within the range of 1200-1400° C.; and 0.8 hour of the retention time. Then, the top and bottom surfaces of the sintered bodies were grinded by using a diamond grind tool. Then, they were divided into a predetermined dimension with a wire-electrical discharge machine. Then, they were brazed on the brazing portion (corner portion) of the insert body made of WC-based cemented carbide, which had the composition of: 5 mass % of Co; 5 mass % of TaC; and the WC balance, and the shape defined by ISO CNGA120412 standard (the 80° diamond shape of: thickness of 4.76 mm; and inscribed circle diameter of 12.7 mm) by using the brazing material made of Ti—Zr—Cu alloy having composition made of: 37.5% of Zr; 25% of Cu; and the Ti balance in volume %. Then, after performing outer peripheral machining into a predetermined dimension, the cutting edges of the brazed parts were subjected to a honing work of: 0.13 mm of the width; and 25° of the angle. Then, by performing the final polishing on them, the tool bodies 2A and 2B with the insert shape defined by ISO CNGA120412 standard were produced.

TABLE 16

| Type | | TiN | TiC | Al | $Al_2O_3$ | cBN |
|---|---|---|---|---|---|---|
| | | Blending composition (mass %) | | | | |
| Tool body | 2A | 50 | — | 5 | 3 | balance |
| | 2B | — | 50 | 4 | 3 | balance |

Next, the coated tools of the present invention 31-40 shown in Table 18 were produced by depositing the hard coating layers including at least the $(Ti_{1-x}Al_x)(C_yN_{1-y})$ layer in the intended layer thicknesses on the surfaces of the tool bodies 2A and 2B in the conditions shown in Tables 3 to 5 with a chemical vapor deposition apparatus in the same manner as Example 1.

In regard to the coated tools 34 to 38 of the present invention, the lower layer shown in Table 17 and the upper layer shown in Table 18 were formed in the forming conditions shown in Table 3.

In addition, for a comparison purpose, the coated tools 31 to 38 shown in Table 19 of Comparative Example were produced by depositing the hard coating layers including at least the $(Ti_{1-x}Al_x)(C_yN_{1-y})$ layer on the surfaces of the tool bodies 2A and 2B with a chemical vapor deposition apparatus, in the conditions shown in Tables 3 to 5 and in the intended layer thicknesses.

In regard to coated tools 34-38 of Comparative Example, the lower layer shown in Table 17 and the upper layer shown in Table 18 were formed in the forming condition shown in Table 3, as in the coated tools 34 to 38 of the present invention.

For purpose of reference, the reference coated tools 39 and 40 shown in Table 19 were produced by depositing the $(Ti_{1-x}Al_x)(C_yN_{1-y})$ layers of the reference examples on the surfaces of the cutting tool bodies 2A and 2B in the intended layer thicknesses with a standard physical vapor deposition by arc-ion plating.

The reference coated tools 39 and 40 were produced by depositing the (Al, Ti)N layer on the surfaces of the above-described tool bodies in the intended composition and the intended layer thicknesses with shown in Table 19 in the conditions for the arc-ion plating used for deposition in the reference example as in Example 1.

The cross sections of each constituent layer of: the coated tools of the present invention 31 to 40; cutting tools 31 to 38 of Comparative Example; and the reference coated tools 39 and 40, were measured by using a scanning electron microscope (magnifying power: ×5000). The average layer thicknesses were obtained by averaging layer thicknesses measured at 5 points within the observation viewing field. In any measurement, the obtained average layer thickness was practically the same as the intended layer thicknesses shown in Tables 17 to 19.

On the coated tools 31 to 40 of the present invention; the coated tools 31 to 38 of Comparative Example; and the reference coated tools 39 and 40, the average Al content ratio $x_{avg}$, the average C content ratio $y_{avg}$, and the area ratio of the crystal grains having the average crystal grain misorientation of 2° or more in the crystal grains having the cubic structure constituting the $(Ti_{1-x}Al_x)(C_yN_{1-y})$ layer were calculated by using the same method as shown in Example 1. Results are shown in Tables 18 and 19.

TABLE 17

| | | | Hard coating layer (the number at the bottom indicates the intended average layer thickness (μm) of the layer) | | |
|---|---|---|---|---|---|
| | | Tool body | Lower layer | | |
| Type | | symbol | 1st layer | 2nd layer | 3rd layer |
| Coated tool of the present invention, coated tool of Comparative Example, and reference coated tool | 31 | 2A | — | — | — |
| | 32 | 2B | — | — | — |
| | 33 | 2A | — | — | — |
| | 34 | 2B | TiC (0.5) | — | — |
| | 35 | 2A | TiN-3 (0.5) | — | — |
| | 36 | 2B | TiN-3 (0.1) | — | — |
| | 37 | 2A | TiN-3 (0.5) | 1-TiCN-2 (3) | — |
| | 38 | 2B | TiN-3 (0.3) | 1-TiCN-2 (7) | TiN-3 (0.7) |
| | 39 | 2A | — | — | — |
| | 40 | 2B | — | — | — |

TABLE 18

| | | | Hard coating layer | | | | | |
|---|---|---|---|---|---|---|---|---|
| | | | Ti and Al complex nitride, carbonitride layer $(Ti_{1-x}Al_x)(C_yN_{1-y})$ | | | | | |
| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | Upper layer (Numbers at the bottom indicate the average intended layer thickness (μm) of the layer) |
| Coated tool of the present invention | 31 2A | G | 0.87 | less than 0.0001 | 53 | 100 | 6 | — |
| | 32 2B | J | 0.65 | less than 0.0001 | 61 | 100 | 2 | — |
| | 33 2A | C | 0.79 | 0.0022 | 42 | 100 | 5 | — |
| | 34 2B | G | 0.85 | less than 0.0001 | 48 | 100 | 1 | — |
| | 35 2A | J | 0.64 | less than 0.0001 | 60 | 98 | 4 | TiN-3 (0.5) |
| | 36 2B | C | 0.75 | 0.0031 | 45 | 100 | 3 | — |
| | 37 2A | G | 0.83 | less than 0.0001 | 49 | 100 | 6 | — |
| | 38 2B | J | 0.63 | less than 0.0001 | 56 | 96 | 4 | — |
| | 39 2A | C | 0.77 | 0.0047 | 48 | 100 | 8 | — |
| | 40 2B | J | 0.61 | less than 0.0001 | 59 | 99 | 3 | — |

TABLE 19

| | | | Hard coating layer | | | | | |
|---|---|---|---|---|---|---|---|---|
| | | | Ti and Al complex nitride, carbonitride layer $(Ti_{1-x}Al_x)(C_yN_{1-y})$ | | | | | |
| Type | Tool body symbol | Formation symbol of TiAlCN deposition process (refer Tables 4 and 5) | Al content ratio x | C content ratio y | Area ratio of crystal grains having the average crystal grain misorientation of 2° or more (%) | Area ratio of the cubic crystals (%) | Intended layer thickness (μm) | Upper layer (Numbers at the bottom indicate the average intended layer thickness (μm) of the layer) |
| Coated tool of Comparative Example | 31 2A | G' | 0.85 | less than 0.0001 | 7 | 100 | 6 | — |
| | 32 2B | J' | 0.63 | less than 0.0001 | 10 | 100 | 2 | — |
| | 33 2A | C' | 0.76 | 0.0022 | 1 | 100 | 5 | — |
| | 34 2B | G' | 0.83 | less than 0.0001 | 4 | 100 | 1 | — |
| | 35 2A | J' | 0.65 | less than 0.0001 | 12 | 98 | 4 | TiN-3 (0.5) |
| | 36 2B | C' | 0.73 | 0.0031 | 4 | 100 | 3 | — |
| | 37 2A | G' | 0.81 | less than 0.0001 | 4 | 100 | 6 | — |
| | 38 2B | J' | 0.61 | less than 0.0001 | 7 | 96 | 4 | — |
| Reference coated tool | 39 2A | AIP | 0.77 | less than 0.0001 | 2 | 100 | 8 | — |
| | 40 2B | AIP | 0.90 | less than 0.0001 | 1 | 100 | 3 | — |

"AIP" indicates deposition by using the arc ion plating.

Next, each coated tool described above was screwed on the tip of the insert holder made of tool steel by a fixing jig. Then, the dry high speed intermittent cutting test of carbolized steel explained below were performed on the coated tools of the present invention 31-40; the coated tools 31 to 38 of Comparative Example; and the reference coated tools 39 and 40. After the tests, width of flank wear of the cutting edge was measured in each test.

Tool body: Cubic boron nitride-based ultra-high pressure sintered material

Cutting test: Dry high-speed intermittent cutting test of carbolized steel

Work: Round bar in JIS-SCr420 standard (hardness: HRC60) with 4 evenly spaced slits in the longitudinal direction Cutting speed: 240 m/min.
Cutting depth: 0.1 mm
Feed rate: 0.12 mm/rev.
Cutting time: 4 minutes
Results are shown in Table 20.

TABLE 20

| Type | | Width of flank wear (mm) | Type | | Cutting test result (minute) |
|---|---|---|---|---|---|
| Coated tool of the present invention | 31 | 0.10 | Coated tool of Comparative Example | 31 | 2.2* |
| | 32 | 0.11 | | 32 | 2.2* |
| | 33 | 0.08 | | 33 | 1.7* |
| | 34 | 0.08 | | 34 | 1.9* |
| | 35 | 0.07 | | 35 | 2.2* |
| | 36 | 0.10 | | 36 | 2.4* |
| | 37 | 0.09 | | 37 | 1.9* |
| | 38 | 0.11 | | 38 | 2.3* |
| | 39 | 0.07 | Reference coated tool | 39 | 2.2* |
| | 40 | 0.10 | | 40 | 1.5* |

Asterisk marks (*) in the column of coated tools of Comparative Example and reference coated tools indicate cutting time (min) until they reached to their service lives due to occurrence of chipping.

Based on results shown in Tables 9, 15, and 20, it was demonstrated that the coated tools of the present invention had improved toughness, while high wear resistance is maintained, because there were strains in crystal grains to improve hardness by having a predetermined average crystal grain misorientation in the cubic crystal grains constituting the Al and Ti complex nitride or complex carbonitride layer of the hard coating layer. Furthermore, the coated tools of the present invention had excellent chipping resistance and defect resistance even in the case where they were used in high-speed intermittent cutting work where intermittent and impact load is exerted on the cutting edge. As a result, the coated tools of the present invention exhibit excellent wear resistance for a long-term usage evidently.

On the contrary, in regard to the coated tools 1-13, 16-28, 31-38 of Comparative Example, and the reference coated tools 14, 15, 29, 30, 39, and 40, which did not have the predetermined average crystal grain misorientation in the cubic crystal grains constituting the Al and Ti complex nitride or complex carbonitride layer of the hard coating layer, it was demonstrated that high heat was generated during cutting; and they reached to the end of service lives in a short time due to chipping, defect, or the like when they were used in high-speed intermittent cutting work where intermittent and impact high load is exerted on the cutting edge, evidently.

INDUSTRIAL APPLICABILITY

As described above, the coated tool of the present invention can be used not only in the high speed intermittent cutting work of alloy steel, but can be used as coated tool for various work materials. Moreover, since it exhibits excellent chipping resistance and wear resistance for a long-term usage, it satisfies the demands for adapting to a cutting apparatus with a higher performance; power-saving and energy-saving in cutting work; and cost-saving, sufficiently.

REFERENCE SIGNS LIST

P: Measurement point (Pixel)
B: Grain boundary
1: Cutting tool body
2: Hard coating layer
3: Complex nitride or complex carbonitride layer

The invention claimed is:
1. A surface-coated cutting tool comprising:
a tool body made of cemented carbide using tungsten carbide, titanium carbonitride cermet, or cubic boron nitride ultra-high pressure sintered material; and
a hard coating layer provided on a surface of the tool body, wherein (a) the hard coating layer comprises at least a Ti and Al complex nitride or complex carbonitride layer, which is deposited by a chemical vapor deposition method and has an average layer thickness of 1 μm to 20 μm; and an average content ratio $x_{avg}$, which is an average content ratio of Al with respect to a total amount of Ti and Al in the Ti and Al complex nitride or complex carbonitride layer, and an average content ratio $y_{avg}$, which is an average content ratio of C with respect to a total amount of C and N in the Ti and Al complex nitride or complex carbonitride layer, satisfy $0.60 \leq x_{avg} \leq 0.95$; and $0 \leq y_{avg} \leq 0.005$, respectively, in a case where a composition formula of the Ti and Al complex nitride or complex carbonitride layer is expressed by $(Ti_{1-x}Al_x)(C_yN_{1-y})$, each of the $x_{avg}$ and $y_{avg}$ is in atomic ratio,
(b) the complex nitride or complex carbonitride layer comprises at least a phase of Ti and Al complex nitride or complex carbonitride having a NaCl face-centered cubic structure, and
(c) an area ratio of crystal grains having an average crystal grain misorientation of 2° or more relative to the Ti and Al complex nitride or complex carbonitride layer is 40% or more, when crystal orientations of crystal grains of Ti and Al complex nitride or complex carbonitride having the NaCl face-centered cubic structure are analyzed along a vertical cross-sectional direction with an electron beam backscattering analyzer and the average crystal grain misorientation of the crystal grains is obtained.
2. The surface-coated cutting tool according to claim 1, wherein the complex nitride or complex carbonitride layer is made of a single phase of Ti and Al complex nitride or complex carbonitride having the NaCl face-centered cubic structure.
3. The surface-coated cutting tool according to claim 1, wherein the hard coating layer includes at least 70 area % or more of a phase of Ti and Al complex nitride or complex carbonitride having the NaCl face-centered cubic structure.
4. The surface-coated cutting tool according to claim 1, wherein a lower layer of a Ti compound layer, which is made of one or more layers of: a Ti carbide layer; a Ti nitride layer; a Ti carbonitride layer; a Ti oxycarbide layer; and a Ti oxycarbonitride layer, is provided between the tool body and the Ti and Al complex nitride or complex carbonitride layer, an average total layer thickness of the lower layer being 0.1 μm to 20 μm.
5. The surface-coated cutting tool according to claim 1, wherein an upper layer including at least an aluminum oxide layer is formed on the complex nitride or complex carbonitride layer, an average total layer thickness of the upper layer being 1 μm to 25 μm.
6. The surface-coated cutting tool according to claim 1, wherein the complex nitride or complex carbonitride layer is deposited by a chemical vapor deposition method using at least trimethyl aluminum as a reaction gas component.
7. The surface-coated cutting tool according to claim 6, wherein during the chemical vapor deposition method, a composition of the reaction gas is changed periodically on the surface of the tool body.
8. The surface-coated cutting tool according to claim 6, wherein
the reaction gas comprises a gas group consisting of $NH_3$ and $H_2$ and another gas group consisting of $TiCl_4$, $Al(CH_3)_3$, $AlCl_3$, $NH_3$, $N_2$, and $H_2$, and the gas group and the other gas group are supplied to the surface of the tool body at different times with time difference.

9. The surface-coated cutting tool according to claim 1, wherein strains are formed in the crystal grains of the complex nitride or complex carbonitride.

* * * * *